United States Patent [19]

Uchida et al.

[11] Patent Number: 5,068,267

[45] Date of Patent: Nov. 26, 1991

[54] SEMICONDUCTOR DEVICE ENCAPSULANT CONSISTING OF EPOXY RESIN COMPOSITION

[75] Inventors: Ken Uchida, Tokyo; Michiya Higashi, Kawasaki; Naoko Kihara, Matsudo; Hiroshi Shimozawa; Akira Yoshizumo, both of Yokohama, all of Japan

[73] Assignee: Kabushiki Kaisha Toshiba, Kawasaki, Japan

[21] Appl. No.: 405,533

[22] Filed: Sep. 12, 1989

[30] Foreign Application Priority Data

Sep. 13, 1988 [JP] Japan ................................ 63-229012

[51] Int. Cl.$^5$ .......................... C08K 3/36; C08G 63/91

[52] U.S. Cl. .................................... 523/435; 523/436; 525/65; 525/68

[58] Field of Search .................. 523/435, 436; 525/65, 525/68

[56] References Cited

U.S. PATENT DOCUMENTS

| | | | |
|---|---|---|---|
| 4,529,755 | 7/1985 | Nishikawa et al. | 523/436 |
| 4,720,515 | 1/1988 | Iji et al. | 523/435 |
| 4,902,273 | 2/1990 | Itoh et al. | 523/435 |
| 4,904,761 | 2/1990 | Okitsu et al. | 523/435 |
| 4,916,174 | 4/1990 | Yoshizumi et al. | 523/436 |

FOREIGN PATENT DOCUMENTS

| | | | |
|---|---|---|---|
| 54-54168 | 4/1979 | Japan . | |
| 54-160453 | 12/1979 | Japan . | |
| 57-184242 | 11/1982 | Japan . | |
| 58-34824 | 3/1983 | Japan . | |
| 58-210920 | 12/1983 | Japan . | |
| 61-208856 | 9/1986 | Japan . | |
| 62-022825 | 1/1987 | Japan . | |
| 1-236226 | 9/1989 | Japan | 523/436 |
| 3-19856 | 3/1991 | Japan . | |

*Primary Examiner*—Lewis T. Jacobs

*Attorney, Agent, or Firm*—Oblon, Spivak, McClelland, Maier & Neustadt

[57] ABSTRACT

An encapsulant consisting of an epoxy resin composition and suitably used to encapsulate a semiconductor device which is to be surface-mounted contains (a) an epoxy resin, (b) a rubber-modified phenolic resin comprising a phenolic resin, and a methylmethacrylate-butadiene-styrene copolymer and a thermosetting silicon rubber dispersed in said phenolic resin, (c) a curing accelerator, and (d) a silica powder.

10 Claims, No Drawings

SEMICONDUCTOR DEVICE ENCAPSULANT CONSISTING OF EPOXY RESIN COMPOSITION

BACKGROUND OF THE INVENTION

1. Field of the Invention

The present invention relates to a semiconductor device encapsulant, consisting of an epoxy resin composition, for providing a cured product having a high thermal shock resistance and high humidity resistance.

2. Description of the Related Art

Conventionally, an epoxy resin composition containing a phenol novolak resin as a curing agent has been used as a semiconductor device encapsulant. This resin composition has been mainly used since its cured product has excellent humidity resistance, high-temperature electrical characteristics and molding properties, and the like.

Recently, as semiconductor elements have been more integrated, functional units on an element have been more miniatualized and a size of a pellet itself have been rapidly increased. Due to such changes in a pellet, a conventional epoxy resin composition has become unable to satisfy characteristics such as a thermal shock resistance. That is, if a conventional epoxy resin composition is used to encapsulate a large pellet having a fine surface structure, a phospho-silicate glass (PSG) film or silicon nitride ($Si_3N_4$) film as a passivation film of an aluminum (Al) pattern formed on the surface of the pellet may crack, or the encapsulating resin may crack. This tendency is significantly increased especially when a thermal cycle test is performed. As a result, an outer appearance of a package or reliability of a semiconductor device is degraded.

In addition, when a surface-mounting type package is to be soldered, the entire package is exposed to a high-temperature atmosphere at 200° to 260° C. for 5 to 90 seconds, i.e., subjected to a severe thermal shock. In this case, cracks may be produced in the encapsulating resin mainly due to vaporization of water absorbed inside it.

In order to solve the above problems, a stress applied on an insert by the encapsulating resin must be reduced, and the encapsulating resin itself must be strengthened throughout a wide temperature range.

In order to reduce an internal stress of the encapsulating resin, it is considered effective to form a so-called sea-island structure in which silicone oil or natural rubber is finely dispersed in a resin matrix. Actually, an internal stress of the encapsulating resin can be considerably reduced by this technique. This technique, however, inevitably has a problem of reducing the strength of a resin cured product and has almost no effect on preventing cracks on a cured product at high temperatures.

SUMMARY OF THE INVENTION

It is an object of the present invention to provide a semiconductor device encapsulant consisting of an epoxy resin composition capable of providing a cured product having a small internal stress, good mechanical characteristics at high temperatures, a high thermal shock resistance, and a high humidity resistance.

A semiconductor device encapsulant consisting of an epoxy resin composition of the present invention contains as its essential components:

(a) an epoxy resin;

(b) a rubber-modified phenolic resin comprising a phenolic resin, and a methylmethacrylate-butadiene-styrene copolymer and a thermosetting silicone rubber dispersed in said phenol resin;

(c) a curing accelerator; and (d) a silica powder.

A cured product of the semiconductor device encapsulant of the present invention has a high thermal shock resistance and a good solder dipping property. The semiconductor device encapsulant can be suitably used to encapsulate a semiconductor memory, especially a large-capacity memory. Even after the resin-encapsulated semiconductor device using the encapsulant of this invention is surface-mounted, its humidity resistance is good. That is, this resin-encapsulated semiconductor device has high reliability.

DETAILED DESCRIPTION OF THE PREFERRED EMBODIMENTS

In the present invention, (a) an epoxy resin may be any resin as long as it contains at least two epoxy groups in one molecule. Examples of the epoxy resin are a bisphenol A-type epoxy resin, a novolak-type epoxy resin, an alicyclic epoxy resin, a glycidyl ether-type epoxy resin, and a tri or tetra(hydroxyphenyl)alkane epoxide. Of these resins, a tris(hydroxyphenyl)methane-based polyfunctional heat-resistant epoxy compound represented by the following formula is suitable in terms of mechanical characteristics at high temperatures:

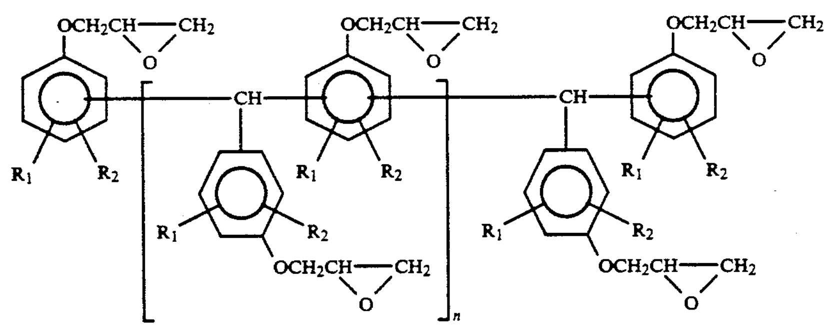

(wherein n represents 0 or a positive integer and each of $R_1$ and $R_2$ independently represents a hydrogen atom or an alkyl group having 1 to 20 carbon atoms.)

This epoxy compound can be prepared by epoxidizing a condensate of phenol or alkylphenol derivatives and hydroxybenzaldehyde. It should be noted that during the above reaction process, an epoxy compound represented by the following formula may be produced by a reaction between epoxy groups:

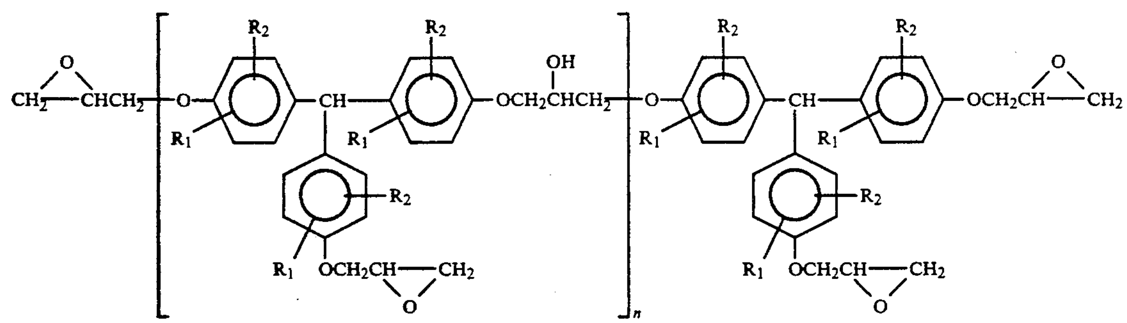

(wherein n represents 0 or a positive integer and each of $R_1$ and $R_2$ independently represents a hydrogen atom or an alkyl group having 1 to 20 carbon atoms.)

Examples of the above polyfunctional heat-resistant epoxy compound are EPPN-502 (NIPPON KAYAKU CO., LTD., softening point=70° C., epoxy equivalent weight=170), YL-932H (YUKA SHELL K.K., softening point=63° C., epoxy equivalent weight=171), and ESX-221 (SUMITOMO CHEMICAL CO., LTD., softening point=85° C., epoxy equivalent weight=210).

In the present invention, examples of a phenolic resin used as a base for (b) a rubber-modified phenolic resin are a novolak-type phenolic resin such as a phenol novolak resin and a cresol novolak resin, and a polyfunctional phenolic resin such as a phenol-aralkyl resin and a dicyclopenthadienephenolic resin. These phenolic resins can be used singly or in a combination of two or more species.

A methylmethacrylate-butadiene-styrene copolymer as one of the rubber components contained in (b) the rubber-modified phenolic resin is generally called an MBS and is powdery. The MBS is manufactured by graft-polymerizing a monomer mainly consisting of methylmethacrylate and styrene with latex-like styrene-butadiene rubber or polybutadiene rubber. Examples of the MBS are B-22 (Kanegafuchi Chemical Industry Co., Ltd., SBR component=about 45%), B-28 (Kanegafuchi Chemical Industry Co., Ltd., SBR component=-about 45%), B-56 (Kanegafuchi Chemical Industry Co., Ltd., SBR component=about 65%), 68K4 (Japan Synthetic Rubber Co., Ltd., SBR component=about 55%), BTA731 (Kureha Chemical Industry Co., Ltd.), and BTA III NX (Kureha Chemical Industry Co., Ltd.)

Of the above MBSs, an MBS containing 70 wt % or less of butadiene and 15 wt % or more of methylmethacrylate is preferred. If the contents of these components fall outside these ranges, an outer appearance of a resin cured product is degraded.

A thermosetting silicone rubber as the other rubber component contained in (b) the rubber-modified phenolic resin may be any rubber as long as it has flowability at 100° C. or less and gels with heat. Examples of such silicone rubber are are rubbers or gels produced by addition reaction or condensation reaction. More specifically, examples of the silicone rubber are TSJ-3150 (TOSHIBA SILICONE CO., LTD., viscosity at 15° C.=1,100 cP), TSJ-3151 (TOSHIBA SILICONE CO., LTD., viscosity at 25° C.=2,300 cP), TSJ-3130 (TOSHIBA SILICOE CO., LTD., viscosity at 25° C.=3,800 cP), TSJ-3175 (TOSHIBA SILICONE CO., LTD., viscosity at 25° C.=3,100 cP), TSE-3504 (TOSHIBA SILICONE CO., LTD., viscosity at 25° C.=10,000 cP), TSE-3051 (TOSHIBA SILICONE CO., LTD., viscosity at 25° C.=700 cP), and JCR-6101 (TORAY SILICONE INC., viscosity at 25° C.=6,500 cp).

This rubber-modified phenolic resin is prepared by heating a phenolic resin up to a temperature higher than a softening point and homogeneously dispersing the rubber component. That is, after the MBS and the silicone rubber are added to a melted phenolic resin, the resultant material need only be stirred and mixed by an arbitrary method. Examples of a mixing method are stirring in a flask by a mixing blade, stirring by a universal mixer, and a method using a homogenizer in a melt pot.

In addition, silicone rubber normally has poor miscibility with a phenolic resin. Therefore, in order to improve dispersion of silicone rubber, it is preferable to add various surfactants such as silicone-type and fluorine-type surfactants to a melted phenolic resin.

Examples of the surfactant are silicone-type SF-8419, SF-8410, and SF-8421 (TORAY SILICONE INC.), and fluorine-type FLORADO FC430 (Sumitomo 3M Co., Ltd.) A content of the surfactant preferably falls within the range of 0.1 to 10 wt % with respect to the phenoic resin. If the content is smaller than the lower limit of this range, the dispersion performance cannot be increased. If the content exceeds the upper limit of this range, molding properties and a humidity resistance are degraded.

Each of the above rubber components contributes to reduce the internal stress of a resin cured product. Contents of the rubber components with respect to the entire composition are preferably set such that a content of the MBS is 0.1 to 7 wt %, that of the silicone rubber is 0.1 to 5 wt %, and a total of the two components is 0.2 to 10 wt %.

If the content of either component is less than the lower limit of the above range, the internal stress of a resin cured product cannot be sufficiently reduced. If the content of the MBS exceeds 7 wt %, melting viscosity of an epoxy resin composition is undesirably increased. If the content of the silicone rubber exceeds 5 wt %, workability in, e.g., kneading of an epoxy resin composition is degraded, and the strength of a resin cured product is significantly reduced. If the total content of the two components exceeds 10 wt %, the strength of the resultant cured product is undesirably largely reduced.

In the present invention, an epoxy resin composition having balanced mechanical characteristics can be obtained by using a rubber-modified phenolic resin containing both the MBS and the silicone rubber. Contents of the methylmethacrylate-butadiene-styrene copolymer, the silicone rubber, and the total of these two components are particularly preferably 0.2 to 5 wt %, 0.2 to 3 wt %, and 0.5 to 6 wt %, respectively.

The rubber-modified phenolic resin and the epoxy resin are preferably mixed such that an equivalent weight ratio between a phenolic hydroxyl group and an epoxy group (OH equivalent weight/epoxy equivalent weight) falls within the range of 0.5 to 1.5. If the equivalent weight ratio falls outside this range, a curing property of the epoxy resin composition is degraded, and a humidity resistance of a resin cured product is degraded.

A novolak-type phenolic resin is cured by using hexamine as a catalyst and used as an insulating material. Since the novolak-type phenolic resin has a small molecular weight as a resin, however, its cured product is brittle. Therefore, the novolak-type phenolic resin has been conventionally modified by tung oil or polybutadiene. A cured product prepared by using such a modified phenolic resin has problems of low electrical characteristics, a contaminated surface, and low strength. In addition, a shock resistance and a thermal shock resistance of the resultant cured product are unsatisfactory.

On the contrary, when a rubber-modified phenolic resin prepared by adding the MBS and the thermosetting silicone rubber to a phenolic resin is cured, a cured product having a high shock resistance and a high thermal shock resistance can be manufactured.

The content of the MBS and the thermosetting silicone rubber in the rubber-modified phenolic resin are set such that the content of the MBS is 1 to 100 wt. %, preferably 2 to 60 wt. %, that of the thermosetting silicone tuber is 1 to 80 wt. %, preferably 2 to 50 wt. %, the total content of these modifiers is 2 to 160 wt. %, preferably 4 to 100 wt. %, with respect to the phenolic resin.

In the present invention, (c) a curing accelerator can be any curing accelerator as long as it is known to be usable as a curing accelerator when an epoxy resin is cured by using a phenolic resin. Examples of such a curing accelerator are an organic phosphine compound such as triphenylphosphine, tricyclohexylphosphine, tributylphosphine, and methyldiphenylphosphine; and diazabicycloundecene. These curing accelerators can be used singly or in a combination of two or more species.

Although it is difficult to determine a content of the curing accelerator since an optimal content depends on the type of a curing accelerator, the content is preferably 0.01 to 10 wt % with respect to the total amount of (a)+(b)+(c). If the content is less than 0.01 wt %, a curing property of an epoxy resin composition is degraded. If the content exceeds 10 wt %, a humidity resistance of the resultant cured product is reduced.

In the present invention, (d) a silica powder is such as a crystalline silica powder, a fused silica powder, or a mixture thereof, and used as a filler. The shape of the powder is not limited. If the shape of the silica powder is shattered, however, its maximum grain size is preferably 75 μm or less in order to prevent an erroneous operation of a semiconductor element. In addition, in order to prevent a soft error, a total content of U and Th in the silica powder is preferably 1 ppb or less. The content of the silica powder is preferably 50 to 90 wt % with respect to the entire encapsulant. If the content is less than 50 wt %, the thermal shock resistance of a resin cured product is degraded. If the content exceeds 90 wt %, the flowability of a melted epoxy resin composition is lowered.

If necessary, the encapsulant of the present invention may contain, in addition to the above components, a mold lubricant such as higher aliphatic acid and waxes; a fire retardant containing antimony, a phosphor compound, and a halogen such as bromine or chlorine; a colorant; and a coupling agent.

The encapsulant of the present invention can be easily manufactured by melting and kneading the above components by using a heat roll, a kneader, or an extruder, mixing the above components by using a special mixing machine capable of fine milling, or by an arbitrary combination of these methods. A resin-encapsulated semiconductor device can be manufactured by resin-encapsulating a semiconductor pellet by using the encapsulant. In this case, although low-pressure transfer molding is most generally used, encapsulating can be performed by injection molding, compression molding, and casting. After curing is preferably performed at a temperature of 150° C. or more. Note that the type of a semiconductor pellet to be encapsulated by the encapsulant is not particularly limited.

The epoxy resin composition constituting the encapsulant of the present invention contains the rubber-modified phenolic resin prepared by using proper amounts of two specific types of rubber components. Therefore, the elasticity of a cured product can be reduced without degrading a molding property or mechanical strength of the cured product. When a specific polyfunctional heat-resistant epoxy resin is used as an epoxy resin, mechanical characteristics of the cured product at high temperatures can be largely improved. An encapsulating resin consisting of the cured product of the epoxy resin composition has a low internal stress and a high crack resistance at high temperatures. Therefore, a semiconductor device encapsulated by this epoxy resin composition has very high reliability.

Examples 1-7 & Comparative Examples 1-4

Epoxy resin compositions were prepared by mixing components presented below at contents listed in Table 1.

Epoxy Resin;

Orthocresol Novolak-Type Epoxy Resin (ESCN-195XL, SUMITOMO CHEMICAL CO., LTD., epoxy equivalent weight=197, softening point=74° C.)

(Example 3 and Comparative Example 1)

Polyfunctional Heat Resistant Epoxy Resin (EPPN502, NIPPON KAYAKU CO., LTD., epoxy equivalent weight=170, softening point=70° C.)

(Examples 1, 2, 4, 5, and 6, Comparative Examples 2 to 4)

Polyfunctional Heat-Resistant Epoxy Resin (ESX-221, SUMITOMO CHEMICAL CO., LTD., epoxy equivalent weight=210, softening point=85° C.)

(Example 7)

Fire-Retardant Epoxy Resin (BREN-s, NIPPON KAYAKU CO., LTD., epoxy equivalent weight=278, softening point=84° C.)

Curing Agent Component;

Phenol Novolak Resin (BRG556, SHOWA HIGH-POLYMER CO., LTD., phenol equivalent weight=104, softening point=80° C.)

Methylmethacrylate-Butadiene-Styrene Copoymer (BTA731, Kureha Chemical Industry Co., Ltd.)

Silicone Gel (TSJ-3150, TOSHIBA SILICONE CO., LTD., viscosity at 25° C.=1,000 cP)

Silicone Oil (dimethylsiloxane, TSE-451-1M, TOSHIBA SILICONE CO., LTD., viscosity at 25° C.=10,000 cP)

Curing Accelerator; Triphenylphosphine (pp-360, K.I. KASEI CO., LTD.)

Filler; Fused Silica Powder (USS-80K, TOSHIBA CERAMICS CO., LTD.)

Mold Lubricant; Carnauba Wax (CARNAUBA NO. 1, ARAKAWA RINSAN KAGAKU K.K.)

Fire-Retardant Agent; Antimony Trioxide (MIKUNI SEIREN K.K.)

Colorant; Carbon Black (CB#30, Mitsubishi Petrochemical Co., Ltd.)

Coupling Agent; γ-glycidoxypropyltrimethoxysilane (A-187, Nippon Unicar Co., LTD)

The rubber-modified phenolic resins (Examples 1 to 7) or the silicone oil-modified phenolic resin (Comparative Example 3) used as a curing agent was prepared as follows.

That is, the rubber-modified phenolic resin was prepared by adding an silicone gel to a melted phenol novolak resin, stirring the resultant mixture in a universal mixer at 120° C. for 30 minutes, increasing the temperature to 150° C., adding an MBS powder, and then stirring the resultant mixture for 30 minutes.

The silicone oil-modified phenolic resin was prepared by adding silicone oil to a melted phenol novolak resin and stirring the resultant mixture in a universal mixer at 120° C. for 30 minutes.

Each epoxy resin composition was prepared as follows. That is, a filler was treated by a coupling agent in a Henschel mixer, other components were added and the resultant mixture was kneaded by a heat roll at 60° to 110° C., and the resultant mixture was cooled and then milled.

The epoxy resin compositions of Examples 1 to 7 and Comparative Examples 1 to 4 were tested as follows.

(1) Melting viscosity at 175° C. was measured by using a KOKA flow tester, thereby estimating flowability of each epoxy resin composition.

(2) Each epoxy resin composition was used to manufacture a test piece by transfer molding at 175° C. for three minutes, and the test piece was after-cured at 180° C. for four hours. A coefficient of linear expansion, a glass transition temperature, a flexural strength, and a Young's modulus in flexure (at room temperature and 215° C.) of each test piece were measured.

(3) The following test was performed in order to check a solder dipping resistance. That is, an estimation semiconductor pellet was encapsulated by using each epoxy resin composition at 175° C. for three minutes to form a 2-mm thick flat package, and the flat package was after-cured at 180° C. for four hours. The resultant package was left to stand in an atmosphere at a temperature of 85° C. and a relative humidity of 85% for 72 hours to perform a moisture absorbing treatment and then dipped in a solder bath at 260° C. for five seconds. At this time, a crack generation ratio of the package was checked. In addition, the resultant solder-dipped package was left to stand in a saturated steam atmosphere at 127° C. for 100 to 400 hours in a pressure cooker, thereby checking a defect (leak defect and open defect) generation ratio.

(4) The following test was performed in order to check a thermal shock resistance. That is, a large (8 mm×8 mm) thermal shock resistance test pellet was encapsulated by using each epoxy resin composition following the same procedures as in item (3) above, and a thermal cycle of −65° C.→room temperature →150° C. was repeated 50 to 400 cycles, thereby checking a defect generation ratio by a device operation characteristic check.

The results are listed in Table 2. As shown in Table 2, the epoxy resin compositions of Examples 1 to 7 had better molding properties and the cured product of them had mechanical characteristics balanced better than those of Comparative Examples 1 to 4 and therefore the cured product of them had a high thermal shock resistance. In addition, when a polyfunctional heat-resistant epoxy resin was used, a crack resistance of the cured product at high temperatures was very high.

TABLE 1

| | | Example 1 | Example 2 | Example 3 | Example 4 | Example 5 | Example 6 | Example 7 | Comparative Example 1 | Comparative Example 2 | Comparative Example 3 | Comparative Example 4 |
|---|---|---|---|---|---|---|---|---|---|---|---|---|
| Epoxy Resin | | | | | | | | | | | | |
| Orthocresol Novolak-Type Epoxy Resin | | — | — | 11.8 | — | — | — | — | 13.6 | — | — | — |
| Polyfunctional Heat-Resistant Epoxy Resin | | 11.3 | 11.3 | — | 11.0 | 11.0 | 11.0 | 11.9 | — | 12.9 | 11.0 | 9.6 |
| Fire-Retardant Epoxy Resin | | 2.5 | 2.5 | 2.5 | 2.5 | 2.5 | 2.5 | 2.5 | 2.5 | 2.5 | 2.5 | 2.5 |
| Curing Agent | | | | | | | | | | | | |
| Rubber-Modified Phenol Resin | Phenol Novolak Resin | 7.5 | 7.5 | 6.7 | 7.3 | 7.3*1 | 7.3*2 | 6.9 | — | — | — | 5.7 |
| | MBS | 1.5 | 1.0 | 1.5 | 1.5 | 1.5 | 1.5 | 1.5 | | | | 6.0 |
| | Silicone Gel | 1.0 | 1.5 | 1.5 | 1.5 | 1.5 | 1.5 | 1.0 | | | | — |
| Phenol Novolak Resin | | — | — | — | — | — | — | — | 7.7 | 8.4 | — | — |
| Silicon Oil-Modified Phenol Resin | Phenol Novolak Resin | — | — | — | — | — | — | — | — | — | 7.3 | — |
| | Silicon Oil | | | | | | | | | | 3.0 | |
| Curing Accelerator | Triphenylphosphine | 0.2 | 0.2 | 0.2 | 0.2 | 0.2 | 0.2 | 0.2 | 0.2 | 0.2 | 0.2 | 0.2 |
| Filler | Fused Silica Powder | 73.0 | 73.0 | 73.0 | 73.0 | 73.0 | 73.0 | 73.0 | 73.0 | 73.0 | 73.0 | 73.0 |

TABLE 1-continued

| | | Example 1 | Example 2 | Example 3 | Example 4 | Example 5 | Example 6 | Example 7 | Comparative Example 1 | Comparative Example 2 | Comparative Example 3 | Comparative Example 4 |
|---|---|---|---|---|---|---|---|---|---|---|---|---|
| Mold Lubricant | Carnavba Wax | 0.3 | 0.3 | 0.3 | 0.3 | 0.3 | 0.3 | 0.3 | 0.3 | 0.3 | 0.3 | 0.3 |
| Fire-Retardant Agent | Antimony Trioxide | 2.0 | 2.0 | 2.0 | 2.0 | 2.0 | 2.0 | 2.0 | 2.0 | 2.0 | 2.0 | 2.0 |
| Colorant | Carbon Black | 0.3 | 0.3 | 0.3 | 0.3 | 0.3 | 0.3 | 0.3 | 0.3 | 0.3 | 0.3 | 0.3 |
| Coupling Agent | γ-glycidoxypropyltrimethoxysilane | 0.4 | 0.4 | 0.4 | 0.4 | 0.4 | 0.4 | 0.4 | 0.4 | 0.4 | 0.4 | 0.4 |

*[1]Silicone-Based Surfactant SF-8421 0.07 Added
*[2]Fluorine-Based Surfactant FLORADE FC-430 0.07 Added

TABLE 2

| | | Example 1 | Example 2 | Example 3 | Example 4 | Example 5 | Example 6 | Example 7 | Comprative Example 1 | Comparative Example 2 | Comparative Example 3 | Comparative Example 4 |
|---|---|---|---|---|---|---|---|---|---|---|---|---|
| melting viscosity (poise) | | 250 | 230 | 300 | 250 | 230 | 230 | 190 | 250 | 200 | 250 | 700 |
| glass transition temperature (°C.) | | 185 | 187 | 160 | 185 | 185 | 185 | 183 | 165 | 187 | 185 | 180 |
| coefficient of linear expansion $\times 10^5$ (1/°C.) | | 1.6 | 1.6 | 1.5 | 1.5 | 1.5 | 1.5 | 1.5 | 1.7 | 1.7 | 1.5 | 1.5 |
| Young's modulus in flexure (kgf/mm$^2$) | | 1250 | 1200 | 1150 | 1150 | 1050 | 1050 | 1250 | 1500 | 1500 | 1100 | 950 |
| flexural strength [R.T.] (kgf/mm$^2$) | | 13.0 | 12.5 | 12.0 | 12.0 | 12.5 | 12.0 | 13.0 | 15.0 | 15.0 | 9.0 | 9.0 |
| flexural strength [215° C.] (kgf/mm$^2$) | | 4.0 | 3.8 | 1.5 | 3.5 | 3.7 | 3.5 | 3.5 | 1.5 | 4.5 | 2.0 | 3.0 |
| thermal cycle test (Number of Defective Sample/Total Number of Samples) | 50 cy | 0/20 | 0/20 | 0/20 | 0/20 | 0/20 | 0/20 | 0/20 | 0/20 | 0/20 | 0/20 | 0/20 |
| | 100 cy | 0/20 | 0/20 | 0/20 | 0/20 | 0/20 | 0/20 | 0/20 | 5/20 | 10/20 | 10/20 | 0/20 |
| | 150 cy | 0/20 | 0/20 | 0/20 | 0/20 | 0/20 | 0/20 | 0/20 | 18/20 | 20/20 | 18/20 | 1/20 |
| | 300 cy | 0/20 | 0/20 | 0/20 | 0/20 | 0/20 | 0/20 | 0/20 | 0/20 | — | 20/20 | 2/20 |
| | 400 cy | 1/20 | 1/20 | 0/20 | 0/20 | 0/20 | 0/20 | 0/20 | — | — | — | 8/20 |
| pressure cooker test (Number of Defective Samples/Total Number of Sample) | crack | 0/20 | 0/20 | 6/20 | 0/20 | 0/20 | 0/20 | 0/20 | 19/20 | 0/20 | 10/20 | 8/20 |
| | 100 hrs | 0/20 | 0/20 | 0/20 | 0/20 | 0/20 | 0/20 | 0/20 | 10/20 | 10/20 | 0/20 | 0/20 |
| | 200 hrs | 0/20 | 0/20 | 0/20 | 0/20 | 0/20 | 0/20 | 0/20 | 20/20 | 20/20 | 0/20 | 0/20 |
| | 300 hrs | 0/20 | 0/20 | 0/20 | 0/20 | 0/20 | 0/20 | 0/20 | — | — | 0/20 | 0/20 |
| | 400 hrs | 1/20 | 2/20 | 10/20 | 1/20 | 5/20 | 7/20 | 0/20 | — | — | 5/20 | 6/20 |

What is claimed is:

1. A semiconductor device encapsulant consisting of an epoxy resin composition, comprising:
   (a) an epoxy resin;
   (b) a rubber-modified phenolic resin comprising a phenolic resin, and 0.1 to 7 wt. % of a graft copolymer of metharcylate and styrene onto a styrene-butadiene copolymer or butadiene polymer, and 0.1 to 5 wt. % of a thermosetting silicone rubber dispersed in said phenolic resin, where the total content of these modifiers is 0.2 to 10 wt. % with respect to the entire encapsulant,
   (c) a curing accelerator; and
   (d) 50 to 90 wt % of a silica powder with respect to the entire encapsulant,
   where said rubber-modified phenolic resin and epoxy resin are mixed such that the equivalent weight ratio between a phenolic hydroxyl group and an epoxy group falls within the range of 0.5 to 1.5.

2. An encapsulant according to claim 1, wherein the epoxy resin is a polyfunctional heat-resistant epoxy compound.

3. An encapsulant according to claim 1, wherein the rubber-modified phenolic resin contains 0.2 to 5 wt % of the graft copolymer and 0.2 to 3 wt % of the thermosetting silicone rubber, the total content of these modifiers being 0.5 to 6 wt %.

4. An encapsulant according to claim 1, wherein 0.01 to 10 wt % of the curing accelerator is contained with respect to a total weight of the epoxy resin, the rubber-modified phenolic resin, and the curing accelerator.

5. An encapsulant according to claim 1, wherein the silica powder contains not more than 1 ppb of a total content of U and Th.

6. An encapsulant according to claim 1, further comprising a mold lubricant, a fire retardant, a colorant, and a coupling agent.

7. A rubber-modified phenolic resin comprising:
   a phenolic resin; and
   a graft copolymer of methylmethacrylate and styrene onto a butadiene polymer or styrene-butadiene copolymer and a thermosetting silicone rubber dispersed in the phenolic resin.

8. A resin according to claim 7, containing 1 to 100 wt % of the methylmethacrylate-butadiene-styrene copolymer and 1 to 80 wt % of the thermosetting silicone rubber, a total content of these modifiers being 2 to 160 wt % with respect to the phenolic resin.

9. A resin according to claim 8, containing 2 to 60 wt % of the graft copolymer and 2 to 50 wt % of the thermosetting silicone rubber, the total content of these modifiers being 4 to 100 wt % with respect to the phenolic resin.

10. A resin according to claim 7, further comprising 0.1 to 10 wt % of a surfactant with respect to the phenolic resin.

* * * * *

UNITED STATES PATENT AND TRADEMARK OFFICE
CERTIFICATE OF CORRECTION

PATENT NO. : 5,068,267

DATED : November 26, 1991

INVENTOR(S) : Ken Uchida et al.

It is certified that error appears in the above-identified patent and that said Letters Patent is hereby corrected as shown below:

On the title page, Item [75]:

The fifth inventor's name is spelled incorrectly, should be, --Akira Yoshizumi--.

Signed and Sealed this

Eighteenth Day of May, 1993

Attest:

MICHAEL K. KIRK

Attesting Officer

Acting Commissioner of Patents and Trademarks